United States Patent [19]

Schutz

[11] Patent Number: 4,649,300

[45] Date of Patent: Mar. 10, 1987

[54] BOOTSTRAP BUFFER

[75] Inventor: Joseph D. Schutz, Portland, Oreg.

[73] Assignee: Intel Corporation, Santa Clara, Calif.

[21] Appl. No.: 764,494

[22] Filed: Aug. 12, 1985

[51] Int. Cl.[4] .................... H03K 4/58; H03K 17/687; H03K 19/017; H03K 17/04

[52] U.S. Cl. .................................. 307/482; 307/578; 307/585; 307/579

[58] Field of Search ............... 307/482, 578, 451, 443, 307/579, 585

[56] References Cited

U.S. PATENT DOCUMENTS 4,587,446  5/1986  Okumura ..................... 307/482 X
4,587,447  5/1986  Baehring ..................... 307/482

FOREIGN PATENT DOCUMENTS 0156427  12/1980  Japan ..................... 307/482

OTHER PUBLICATIONS

Patel, "Precharge for Bootstrap Circuit," IBM Tech. Discl. Bull., vol. 20, No. 7, p. 2748, Dec. 1977.

Primary Examiner—Stanley D. Miller
Assistant Examiner—David R. Bertelson
Attorney, Agent, or Firm—Blakely, Sokoloff, Taylor & Zafman

[57] ABSTRACT

A bootstrapped driver particularly suitable for CMOS integrated circuits. The circuit permits precharging of gates which require bootstrapping in the driver, thus avoiding the time required in prior art circuits to charge relatively large gate capacitance after the input signal is applied to the driver. A circuit is provided to reduce the bootstrapping of the gate after it has begun to reduce possible gate edge aided breakdown. Substantial improvement in rise time or fall time is achieved.

4 Claims, 4 Drawing Figures 4,649,300

BOOTSTRAP BUFFER

BACKGROUND OF THE INVENTION

1. Field of the Invention

The invention relates to MOS buffers, particularly those which employ electrical bootstrapping.

2. Prior Art

In the fabrication of metal-oxide-semiconductor (MOS) integrated circuits, there is sometimes a need for a bootstrapped potential. That is, a line in the circuit may have to be raised above the power supply potential or below the ground potential. For example, bootstrapped potentials are used on the word lines of dynamic memories. Raising the potential on these word lines above the potential of the power supply or below the ground potential eliminates the threshold voltage drop of the transistors which couple the storage capacitance to bit lines. This enables complete transfer of charge, some of which would otherwise be lost. There are numerous other applications for bootstrapped potentials in MOS integrated circuits.

A bootstrap buffer which Applicant believes is the closest to that of the present invention will be discussed in conjunction with FIG. 1. As will be seen, the present invention provides a considerable speed increase over this prior art circuit. Another bootstrapped buffer is shown in U.S. Pat. No. 3,937,983.

SUMMARY OF THE INVENTION

An MOS bootstrap driver circuit or buffer for receiving an input signal and for providing a bootstrapped output signal is described. First, second and third field-effect transistors are coupled in series. The second transistor includes a gate and two terminals. Capacitance means for providing electrical capacitance between one of the terminals of this second transistor and its gate is used. This capacitance means may be the parasitic capacitance associated with the second transistor. Charging means are employed for charging capacitance means prior to application of the input signal. The gate of the second transistor is automatically "booted".

With this arrangement, it is not necessary to charge the gate of a transistor after the input signal is applied to the circuit as is done in prior art circuits. The prior art technique results in a slower performing circuit since capacitance charging is done after the input signal is applied to the circuit and the parasitic capacitance associated with the gate can not fully aid in auto bootstrapping.

DETAILED DESCRIPTION OF THE PRESENT INVENTION

A metal-oxide-semiconductor (MOS) integrated circuit for providing a bootstrapped output particularly suited for complementary MOS fabrication is described. In the presently preferred embodiment, numerous specific details are set forth such as specific conductivity types in order to provide a thorough understanding of the present invention. However, it will be obvious to one skilled in the art that the present invention may be practiced without these specific details. Well-known processing needed to fabricate the invention is not described, nor are other well-known details, in order not to unnecessarily obscure the present invention.

PRIOR ART CIRCUIT OPERATION

Figure 1:
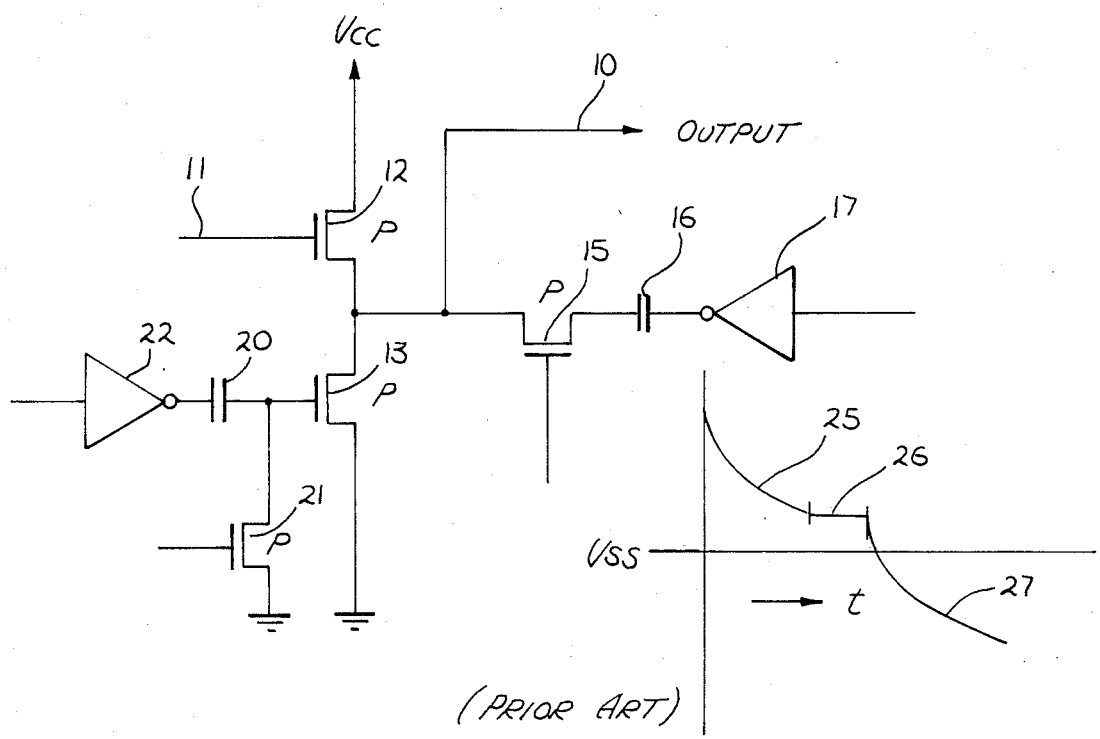
FIG. 1 is an electrical schematic of a prior art circuit and includes a graph showing the response of the circuit.

In FIG. 1 a bootstrap buffer circuit which provides a bootstrapped output moving beyond supply potential by capacitive coupling on line 10 in response to an input signal on line 11 is shown. In this p-channel embodiment transistors 12 and 13 are coupled in series and provide the principal control. Transistor 15 along with capacitor 16 and inverter 17 provide bootstrapping below the ground potential shown as segment 27 of the curve. The inverter 22 and capacitor 20 and transistor 21 provide bootstrapping for the gate of transistor 13.

In operation the input signal is applied to line 11 turning off transistor 12. Transistor 21 is used to bring the gate of transistor 13 to ground allowing line 10 to be pulled toward ground potential as shown by segment 25 of the curve. The inverter 22 is then clocked low and capacitor 20 is used to bring the gate of transistor 13 below ground once transistor 21 is turned off. Transistor 13 is then turned off by clocking inverter 22 high.

The capacitor 16 which is previously charged is coupled to line 10 when the gate of transistor 15 is brought below ground potential. The gate of transistor 15 is brought below ground with a circuit similar to that coupled to the gate of transistor 13. Once the voltage on the gate of transistor 13 has started to turn off, the voltage on node 10 stops charging to ground. The output 13 is left floating until transistor 15 and capacitor 16 are fully connected and operational which takes some number of nanoseconds (e.g., 4-6). This is shown as segment 26 in the curve. The inverter 17 is now clocked low, causing capacitor 16 to boot line 10 below ground potential as shown by segment 27. The capacitor 16 is typically large and matched against the load coupled to line 10.

One problem with the circuit of FIG. 1 is that the capacitor 20 is charged after the input signal is applied to line 11. Note that transistor 13 must remain off until the input signal is applied, otherwise a current path will exist between $V_{CC}$ and ground through transistors 12 and 13. The charging of the capacitor 20 and the capacitance associated with the gate of transistor 13 takes a relatively long time as shown by the segment 25 of FIG. 1. There is a similar delay associated with bringing the gate of transistor 15 below ground as shown by segment 26.

As will be seen, the present invention shortens the time required to bootstrap the gates of transistors 13 and 15 or like transistors and thereby substantially increases the speed of the circuit.

CIRCUIT OF FIG. 2

Figure 2:
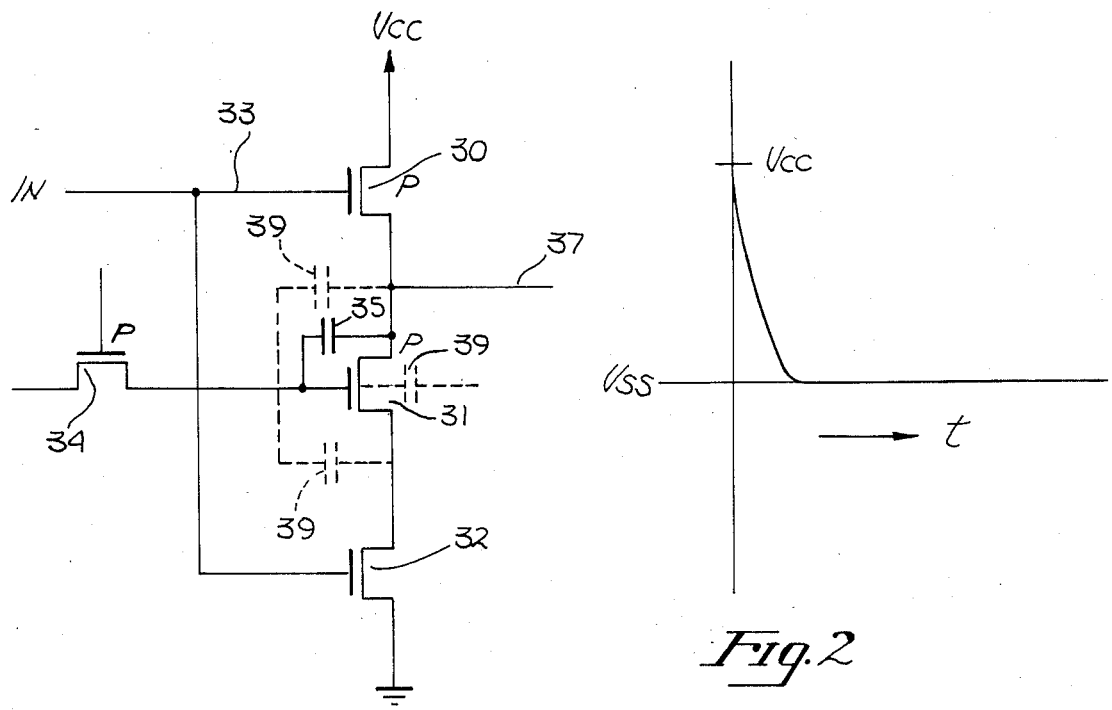
FIG. 2 is an electrical schematic showing a concept used in the present invention in its most simplified form.

In FIG. 2 a simplified circuit is shown to demonstrate a concept employed in the present invention. In the simplified buffer of FIG. 2 no bootstrapping is used on line 37 such as was shown in FIG. 1 and associated with the capacitors 16.

For the circuit of FIG. 2, the p-channel transistor 30 is coupled in series with the n-channel transistors 31 and 32. The input line 33 is coupled to the gates of transistors 30 and 32. Note with a p-channel transistor and n-channel transistor the same potential can be used to turn one off and the other on.

The capacitor 35 is coupled between the gate of transistor 31 and the line 37. This capacitor is charged through transistor 34.

In operation, before an input signal is applied, transistor 30 is on and transistor 32 is off. Thus line 37 is coupled to $V_{CC}$ through transistor 30. Before the input signal is applied, transistor 34 is used to charge capacitor 35 to $V_{SS}$ and then its gate is returned to $V_{SS}$ potential. That is, the gate of transistor 31 is brought to ground potential while line 37 is held at $V_{CC}$ through transistor 32. Transistor 34 may be relatively small since the rate at which capacitor 35 is charged does not directly affect the performance of the circuit. This improves bootstrapping efficiency since no trade off is made between charging time and the parasitic capacitance associated with transistor 34 and it degrading in part on the final voltage on the gate of transistor 31 after booting.

Once the input signal is applied to line 33, transistor 32 conducts and transistor 30 is cut off. As can be seen from the graph, the output line 37 immediately falls in potential and the charge on transistor 35 provides bootstrapping of the gate of transistor 31. This assumes that line 37 quickly drops to $V_{SS}$. As can be seen from the graph of FIG. 2 there is no "flatness" to the performance curve.

Importantly, with the circuit of FIG. 2, the charging of capacitor 35 can occur before the input signal is applied. This is in contrast to the circuit of FIG. 1 where the charging of the bootstrap capacitor 20 occurs after the input signal is applied. As will be seen in FIG. 3, the concept described in FIG. 2 is used for bootstrapping gates in the circuit of FIG. 3.

While in FIG. 2 a capacitor 35 is illustrated, the parasitic capacitance associated with the gate of transistor 31 may be used to advantage. In fact, the channel capacitance and gate to source and gate to drain capacitance (illustrated by the parasitic capacitors 39) all aid in the bootstrapping and in most cases will be sufficient without capacitor 35. This lowers the power consumption of the driver, improving the speed power product.

PREFERRED EMBODIMENT OF FIG. 3

Figure 3:
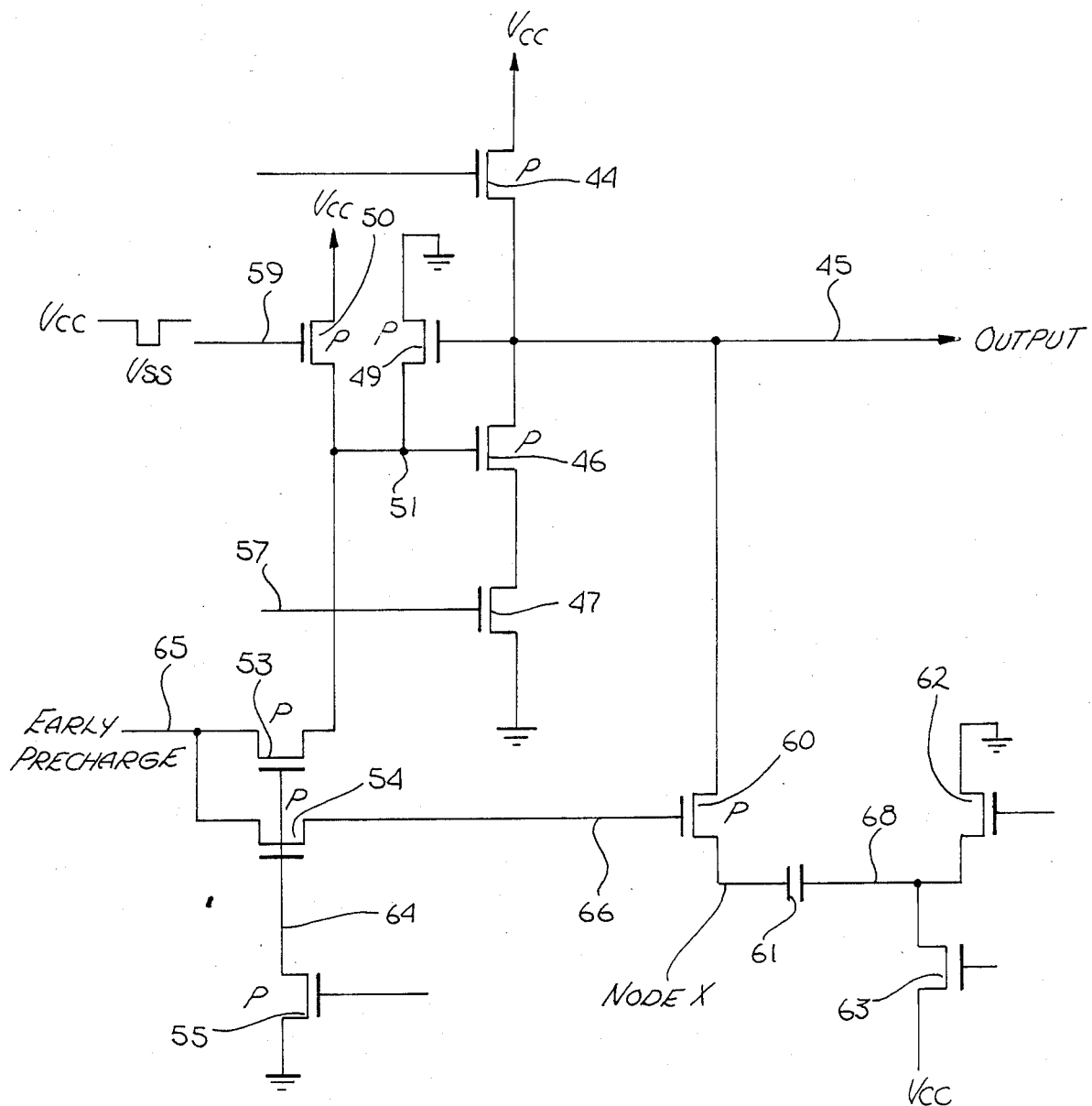
FIG. 3 is an electrical schematic showing the presently preferred embodiment of the present invention.

In the currently preferred embodiment as illustrated in FIG. 3 the output line 45 is coupled to $V_{CC}$ through the p-channel transistor 44 and to ground through the p-channel transistor 46 and n-channel transistor 47. The input signal is applied to line 57 and the pull-up transistor 44 is turned off upon application of the input signal or before.

A relatively large capacitor 61 (corresponding to capacitor 16 of FIG. 1) is used to bootstrap the line 45 below ground potential. Transistors 60, 62 and 63 are used for charging and coupling this transistor to line 45.

Transistors 49 and 50 associated with node 51 (gate of transistor 46) are used to control the bootstrapping voltage on transistor 46. The gate of transistor 46 is bootstrapped as described in conjunction with FIG. 2 through the precharging of its parasitic capacitance. Transistor 50 discharges node 51 (above ground); transistor 49 pulls the node back to ground as the output drops. This is an important feature of the circuit since it reduces possible gate edge aided breakdown of transistor 46.

The p-channel transistors 53, 54 and 55 are used for precharging capacitance associated with the gates of transistors 46 and 60.

Figure 4:
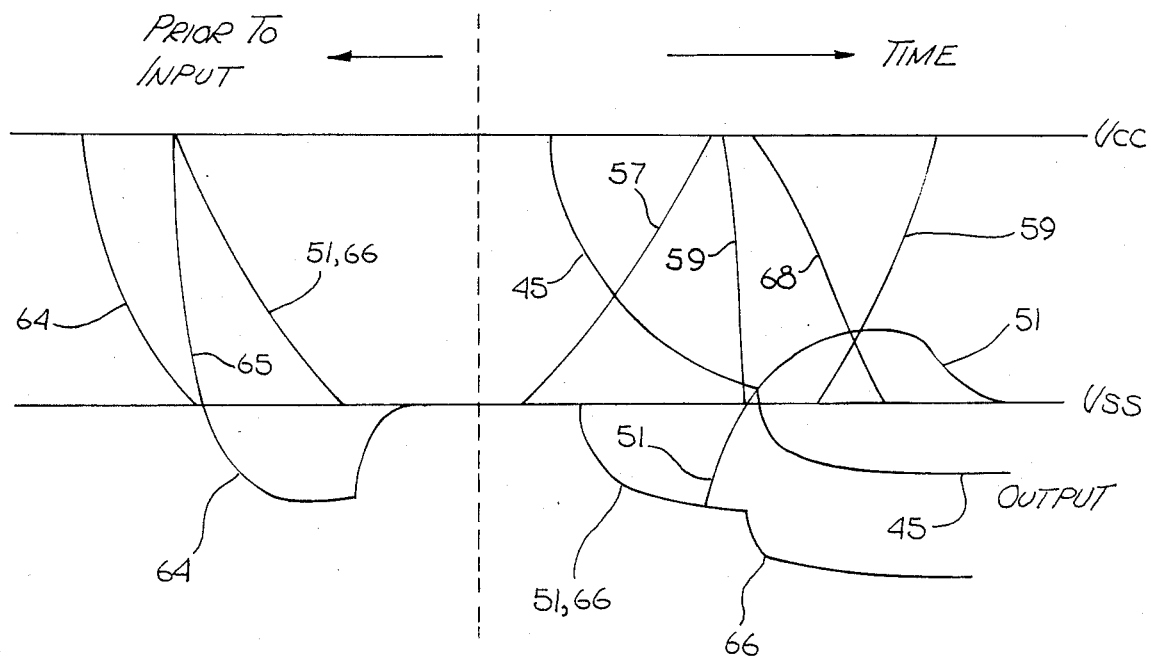
FIG. 4 is a series of graphs used to describe the operation of the circuit of FIG. 3.

Various lines and nodes of FIG. 3 have been numbered such as lines 65, 66, etc., and the same number are used in FIG. 4 to show the potential on these lines and nodes during the operation of the circuit.

Prior to the time that an input signal is applied to line 57, line 45 is pulled to $V_{CC}$ potential through transistor 44. During this period of time the precharging of nodes 51 and 66 occurs. Node 64 is itself bootstrapped and has been precharged by transistor 55 to $V_{SS}$ as illustrated in FIG. 4. The potential on this node boots below $V_{SS}$ allowing the voltage on node 65 ($V_{SS}$) to be fully transferred to both nodes 51 and 66. That is, nodes 51 and 66 are brought to ground potential at this period of time.

As mentioned, transistor 44 is turned off and the input signal (line 57) is applied to the gate of transistor 47. Immediately after the input signal is applied, line 45 drops in potential (towards ground) since both transistors 46 and 47 are conducting. As line 45 drops in potential, automatic bootstrapping occurs of the gate of transistor 46 and the gate of transistor 66 as discussed in conjunction with FIG. 2. This is shown in FIG. 4 by the potential on nodes 51 and 66 dropping below $V_{SS}$.

Once the output reaches near $V_{SS}$ potential a pulse is applied to line 59, node 51 changes in potential (e.g., from $-3$ volts to $V_{CC}/2$). As mentioned, transistors 49 and 50 are used to reduce possible gate edge aided breakdown of the gate of transistor 46.

Once transistor 46 is cut off by having its gate charged to a potential higher than one $V_{Tp}$ below the potential on node 45 (which is close to $V_{SS}$), node 68 is brought low. This node is previously charged to $V_{CC}$ while node "X" is charged to $V_{SS}$. Once the precharging of nodes 51 and 66 to $V_{SS}$ starts node X charges to $V_{CC}$ causing node 68 to bootstrap above $V_{CC}$ potential. It reaches a potential as high as $2V_{CC}$. Transistors 62 and 63 are off having their gates at $V_{SS}$ and $V_{CC}$ respectively. This causes the charge previously stored on capacitor 61 to bootstrap the line 45 through transistor 60. As is illustrated, line 45 drops below $V_{SS}$ as node 68 drops in potential.

A substantial improvement in the rise time or fall time of the output line is realized with the improvements of FIG. 3. A prior art circuit fabricated as shown in FIG. 1 has a typical fall time of 24 nsec. In contrast, the circuit of FIG. 3 has been demonstrated with an 8 nsec. fall time.

Additionally, the flat spot in the output of the prior art circuit in FIG. 1 is eliminated because of the simpler architecture of this invention.

Thus, an improvement in a bootstrap buffer has been described which provides substantial improvement in speed.

I claim:

1. An MOS bootstrap driver circuit for receiving an input signal and for providing a bootstrapped output signal comprising:

a first, second and third transistor coupled in series said input signal being coupled to the gate of one of said first and third transistors;

said bootstrapped output signal being present on one of said terminals of said second transistor;

a first bootstrapping circuit for providing a bootstrapped potential;

a fourth transistor coupled between said first bootstrapping circuit and said one terminal of said second transistor;

first capacitance means for providing electrical capacitance between said one of said terminals of said second transistor and the gate of said second transistor;

second capacitance means for providing electrical capacitance between the gate of said fourth transistor and one of the terminals of said fourth transistor;

charging means for charging said first and second capacitance means prior to said input signal being applied to said circuit, whereby said bootstrapped output signal is realized.

2. The circuit defined by claim 1 including means for reducing bootstrapping of said gate of said second transistor.

3. The circuit defined by claim 2 wherein said charging means includes a fifth transistor coupled to said gate of said second transistor and a sixth transistor coupled to said gate of said fourth transistor, and a second bootstrapping circuit coupled to the gates of said fifth and sixth transistors for bootstrapping said gates of said fifth and sixth transistors when said first and second capacitance means are charged.

4. The circuit defined by claim 2 wherein said first and third transistors are of opposite conductivity types.

* * * * *